United States Patent
Rearick et al.

(10) Patent No.: US 7,139,948 B2
(45) Date of Patent: Nov. 21, 2006

(54) METHOD FOR DETERMINING THE IMPACT ON TEST COVERAGE OF SCAN CHAIN PARALLELIZATION BY ANALYSIS OF A TEST SET FOR INDEPENDENTLY ACCESSIBLE FLIP-FLOPS

(75) Inventors: Jeffrey R. Rearick, Fort Collins, CO (US); Manish Sharma, Urbana, IL (US)

(73) Assignee: Avago Technologies General IP(Singapore) Pte. Ltd., Singapore (SG)

( * ) Notice: Subject to any disclaimer, the term of this patent is extended or adjusted under 35 U.S.C. 154(b) by 35 days.

(21) Appl. No.: 10/401,844

(22) Filed: Mar. 28, 2003

(65) Prior Publication Data

US 2004/0204895 A1 Oct. 14, 2004

(51) Int. Cl.
*G01R 31/28* (2006.01)
(52) U.S. Cl. .................................................... 714/726

(58) Field of Classification Search ................. 714/724, 714/726, 727, 728, 729, 730, 732, 739
See application file for complete search history.

(56) References Cited

U.S. PATENT DOCUMENTS 5,574,733 A * 11/1996 Kim ........................... 714/728

* cited by examiner

*Primary Examiner*—Guy Lamarre
*Assistant Examiner*—James C. Kerveros

(57) ABSTRACT

In one embodiment of the present invention, a scan test methodology is implemented which generates a test pattern set. A linear-time analysis is then performed on the test pattern set. As a result a new test pattern set is generated. Comparisons are made between the original test pattern set and the new test pattern set to analyze any difference in faults detected by the original test pattern set and the new test pattern set. If there are any differences in faults, test pattern generation is performed using the new test pattern set and the original test pattern set is used to augment the new test pattern set.

18 Claims, 6 Drawing Sheets

METHOD FOR DETERMINING THE IMPACT ON TEST COVERAGE OF SCAN CHAIN PARALLELIZATION BY ANALYSIS OF A TEST SET FOR INDEPENDENTLY ACCESSIBLE FLIP-FLOPS

BACKGROUND OF THE INVENTION

1. Field of the Invention

This invention relates to electronic systems. Specifically, the present invention relates to testing electronic systems.

2. Description of the Related Art

Scan tests are often used in digital logic designs to test the design for manufacturing defects, which result in faulty circuit behavior. For example, a microprocessor or Application Specific Integrated Circuit (ASIC) may include tens of millions of logic gates in one device. Internal scan tests are used to test the logic gates in these various devices to assure that they have been manufactured correctly.

To create these internal scan tests, an automated test pattern generator (ATPG) is employed. The ATPG is software that analyzes a model of a circuit (called a netlist), identifies a set of potential fault sites, and generates test patterns that are necessary to test the fault sites.

Storage elements (called flip-flops) on the device under test are connected serially during test operations into a scan chain. FIG. 1A displays a conventional scan chain. In FIG. 1A scan chain segments 102, 104, and 106 are connected serially and form the scan chain. Each scan chain segment 102, 104, and 106 includes flip-flops, such as flop-flops 101, 103, and 105. Lastly, a scan input data pin 100 is also shown. A test pattern is applied to the scan chain through the scan input data pin 100.

A conventional circuit includes logic gates and flip-flops connected in a scan chain. Each scan chain may contain a unique collection of flip-flops organized as a shift register during test operations. A test pattern is shifted into the scan chain serially, one bit per clock cycle. The test pattern provides an input to logic gates connected to the flip-flops comprising the scan chain. As a result, the outputs (i.e., response to the test pattern) of the logic gates are stored in the flip-flops that are part of the scan chain. As the response is shifted out of the scan chain, another test pattern is shifted into the scan chain. Each test pattern is generated with the intention of discovering faults in the logic surrounding the flip-flops in the scan chain. Therefore, the ATPG generates patterns that will place specific states in the flip-flops comprising the scan chain so that faults in the surrounding logic can be identified. For example, if there are 1000 flip-flops and a fault would be exposed when there is a logical 1 on the $3^{rd}$ device in the scan chain and a logical zero on the $579^{th}$ device in the scan chain, the ATPG would generate a test pattern with a logical 1 as the $3^{rd}$ bit and a logical zero as the $579^{th}$ bit.

Typically, every logic gate on the device is tested. Therefore, a tremendous amount of data is generated with each test pattern and a substantial amount of test patterns have to be generated to properly test a device. For example, ATPG programs may run for weeks to create test patterns for large, complex circuits.

Since the flip-flops are connected in a serial chain and each bit in the test pattern is shifted into the scan chain at the rate of one bit per clock cycle, when there are tens of millions of bits, it takes a substantial amount of time to shift the test patterns into the scan chain. The cost of performing the scan chain test is directly proportional to the amount of time required to perform the test. As a result, a number of techniques have been developed to attempt to optimize the time and lower the cost associated with scan chain testing.

One technique for lowering the cost associated with scan test involves reducing the amount of data that is shifted into the scan chain. However, shifting half of the data into the scan chain results in half of the quality in the output product and may increase rework cost and reduce profit. The devices may ship faster and incur less cost during test; however, since the quality is lower, the repair and maintenance issues increase and drive up the cost.

Another technique for lowering the cost associated with scan test is to replace a single long scan chain with several shorter scan chains that contain the same flip-flops. This allows the same total amount of scan data to be loaded and unloaded in less time. However, since each scan chain requires one pin for scan input data and another pin for scan output data, there will be an upper limit on the number of independently accessible scan chains that can be constructed.

One conventional cost reduction technique mitigates this limitation by sharing the scan input data among several short scan chains. The technique is commonly referred to as the "Illinois Scan" configuration (i.e., invented at the University of Illinois). FIG. 1B displays the "Illinois Scan" configuration. In the Illinois scan configuration, the scan chain segments that were initially connected serially (i.e., 102, 104, 106 of FIG. 1A) are now connected in parallel with a common scan input data pin 100. For illustration by comparison, using FIG. 1A, scan chain segments 102, 104, and 106 would typically be connected serially so that they are independently accessible (i.e., unique data could be loaded into each flip-flop). However, in the Illinois Scan configuration, the scan chains (102, 104, 106) are connected in parallel and the same serial bit stream is shifted into each scan chain at the same time. Therefore, as the serial bit stream is shifted into the shared scan input data pin 100, all flip-flops on parallel scan chains at a given logical distance downstream of the scan input data pin 100 will be loaded with identical data. For example, on the fourth clock cycle, the same logical bit will reside in flip-flop 101, flip-flop 103, and flip-flop 105.

Although the Illinois Scan configuration does improve on the prior art, this technique has shortcomings. For example, the same data is shifted into each scan chain. As such, the same data arrives at devices that are parallel to each other. For example, the same logical state will reside on flip-flop 101, 103, and 105. However, some faults may not be detectable unless flip-flop 101 is logical 0, flip-flop 103 is a logical 1, and flip-flop 105 is a logical 1. Since the same logical state resides on flip-flops 101, 103, and 105 in the Illinois Scan configuration, there is no way to introduce the bit pattern that will expose this fault using the Illinois Scan configuration. As a result, using the Illinois Scan configuration in this manner, it will not be possible to test the device for all possible faults (i.e., complete fault coverage).

The additional positional constraints placed on the ATPG when using the Illinois Scan configuration complicate the test generation process, and the effort expended by the ATPG to prove that such faults are untestable can be exponential in run time. Furthermore, any faults that are undetectable solely as a result of the scan configuration must be tested by other means. For example, the ATPG may reapply the test pattern with the scan chain reconfigured back to the original serial configuration (i.e., FIG. 1A).

Thus, there is a need for a more efficient scan test creation process that takes advantage of the efficiencies provided by a shared scan input data pin while minimizing the extra work in pattern creation to maintain complete fault coverage.

SUMMARY OF THE INVENTION

An automated test method is presented. An original test pattern set is generated to test a serial scan chain. The serial scan chain is reconfigured into parallel scan segments that share a scan input data pin (i.e., for example, Illinois Scan configuration). The original test pattern set is analyzed relative to the parallel scan segments that share a scan input data pin to test for compatibility. The analysis is a linear-time analysis. A new test pattern set is generated as a result of the analysis. Faults detected by the new test pattern set are compared with faults detected by the original test pattern set. If the new test pattern set detects less faults than the original test pattern set test generation is performed using the new test pattern set. The faults detected by the test generation are added to the new test pattern set. If the new test pattern set detects fewer faults than the original test pattern after the test generation, then test patterns from the original test pattern set are used to augment the new test pattern se A method of testing comprises the steps of generating a first test pattern set including at least one test pattern including bits each in a bit position; analyzing the test pattern set for compatibility with a scan chain configuration including flip-flops corresponding to the bit position; and generating a new test pattern set in response to analyzing the test pattern set for compatibility with the scan chain configuration.

A method of testing comprises the steps of generating a first test pattern set, the first test pattern set testing a circuit including a serial scan chain for first faults; generating a second test pattern set including bits in response to the first pattern set, the second test pattern set testing a circuit including a parallel scan chain configuration for second faults, the parallel scan chain configuration including flip-flops; and generating a third test pattern set to test the circuit including the parallel scan chain configuration for third faults, where the second faults plus the third faults equal the first faults.

A method of testing comprises the steps of generating a plurality of first test patterns capable of testing for first faults; generating at least one second test pattern capable of testing for second faults; identifying third faults by comparing the first faults to the second faults; performing test generation on the third faults; identifying at least one of the plurality of first test patterns that test the third faults; and adding the at least one of the plurality of first test patterns that is also capable of testing the third faults to the at least one second test pattern.

A method of generating test patterns comprises the steps of generating a first test pattern set capable of testing a circuit including a serial scan chain; and generating a second test pattern set capable of testing a circuit including a parallel reconfiguration of the serial scan chain.

DESCRIPTION OF THE INVENTION

Figure 1A:
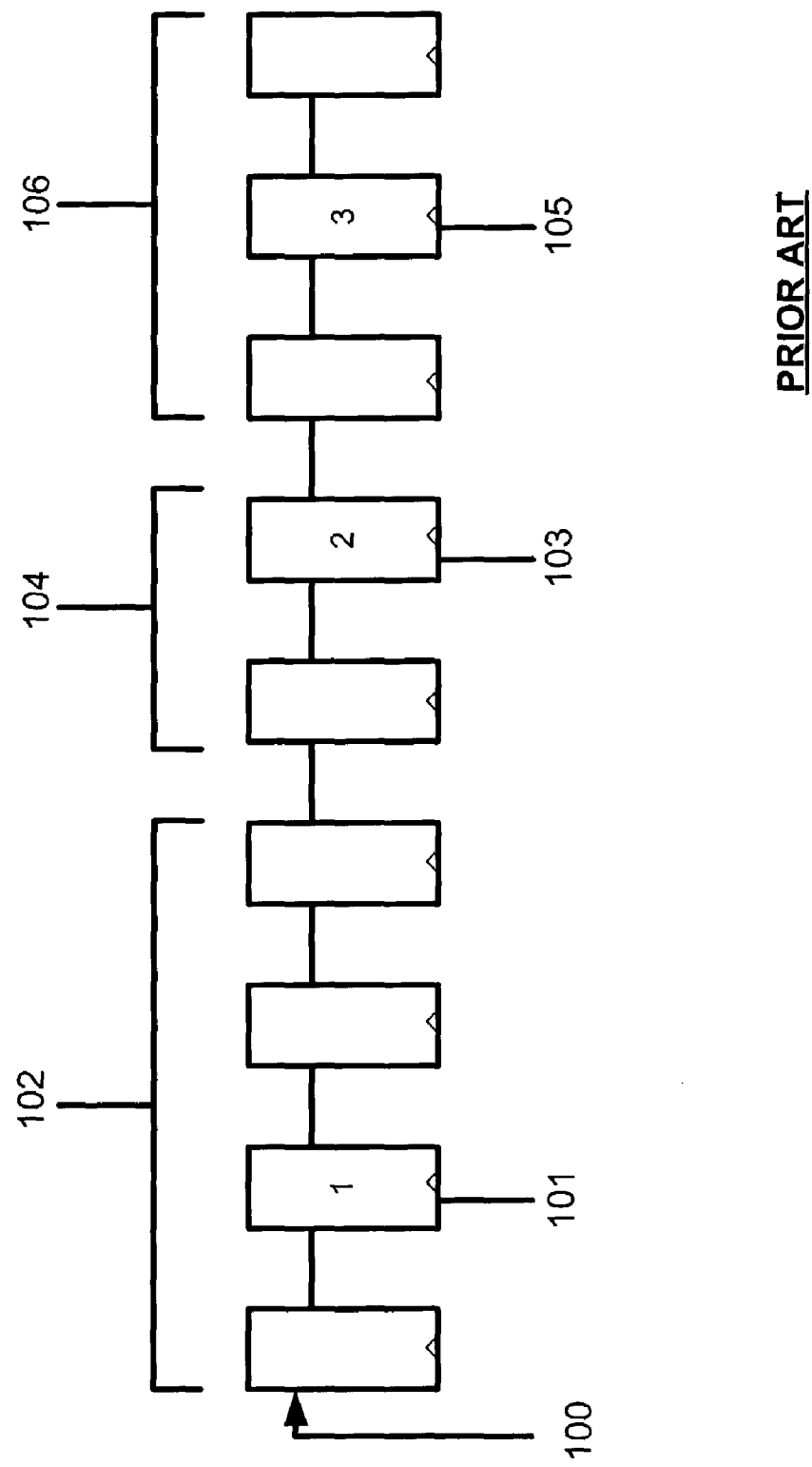
FIG. 1A displays a conventional serial scan chain configuration.
Figure 1B:
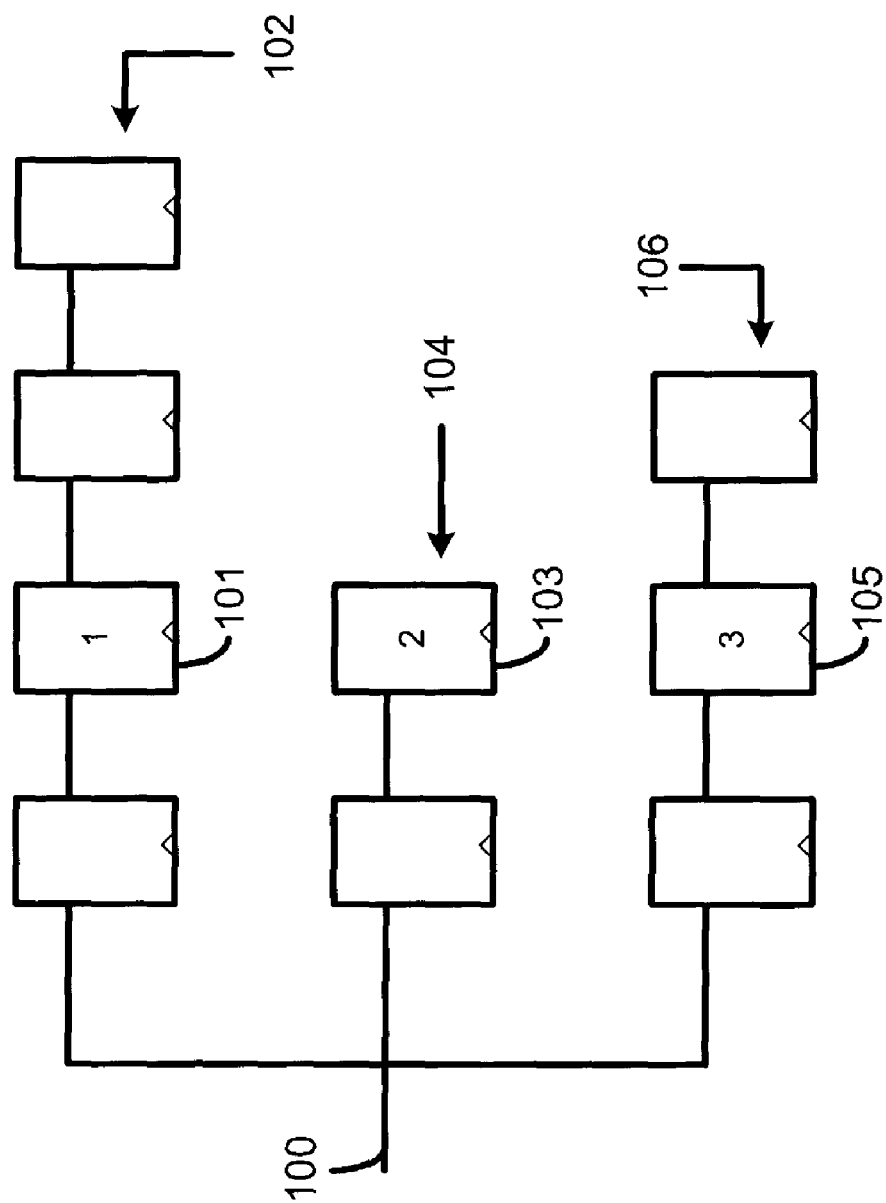
FIG. 1B displays a conventional Illinois Scan chain configuration.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

In one embodiment of the present invention, an original test pattern is generated. The original test pattern includes a list of 1's and 0's generated by an ATPG. For example, in a scan chain with thirty devices, the original test pattern would include a combination of thirty 1's and 0's. The original test pattern will detect a number of faults. In addition, it will take several original test patterns to test a variety of faults. The original test patterns form a set, which we will refer to as the "original test pattern set."

The original test pattern set is then analyzed to determine if the original test pattern set is compatible with a parallel scan segment configuration in which an input pin is shared. For example, analysis is performed to determine if the bits shifted into parallel scan segments, of a parallel scan segment configuration that shares the scan input data pin, is the same. For example, an original 9-bit pattern 101101101 is compatible with a three parallel scan chain segment configuration where the input data pin is shared such that reduction to a 3-bit pattern "101" would fill the 9 flip-flops with the same data as the original pattern, but in one-third the time. It is important to note that the complexity of this analysis is a linear function of the number of flip-flops in the scan chain segment, as opposed to the ATPG, which is exponentially related to the number of flip-flops in the scan chain segment.

The odds of finding such a convenient mapping between an original pattern and a proposed parallel scan segment configuration, in which a scan input data pin is shared, may seem to be low; however, the nature of automatically generated test patterns is such that there is considerable opportunity for compatibility. ATPG produces an original test pattern in which the majority of bits in the original test pattern are unspecified (i.e., neither logical 0 or logical 1 is required, so the bit is known as a "don't care"). Typically, as many as ninety-eight percent of the bits may be left unspecified in an original test pattern. In order to test a specific fault, only a small subset of bits are typically specified in the original test pattern set. For example, in a thirty-bit scan chain, perhaps only two bits are required to expose a fault and the other twenty-eight bits may remain unspecified. The "don't care" bits are compatible with either a logical 0 or a logical 1. As a result, the large percentage of "don't care" bits increase the odds that the original test pattern can meet the requirements imposed by a parallel scan segment configuration in which an input data pin is shared, which requires that identical bit positions in parallel scan segments contain identical data.

Therefore, once the original test pattern set is generated, a compatibility analysis may be performed. During the compatibility analysis, the bits that are unspecified may be converted to a logical state that would comply with the requirements imposed by a parallel scan segment configuration in which an input data pin is shared.

Figure 2A:
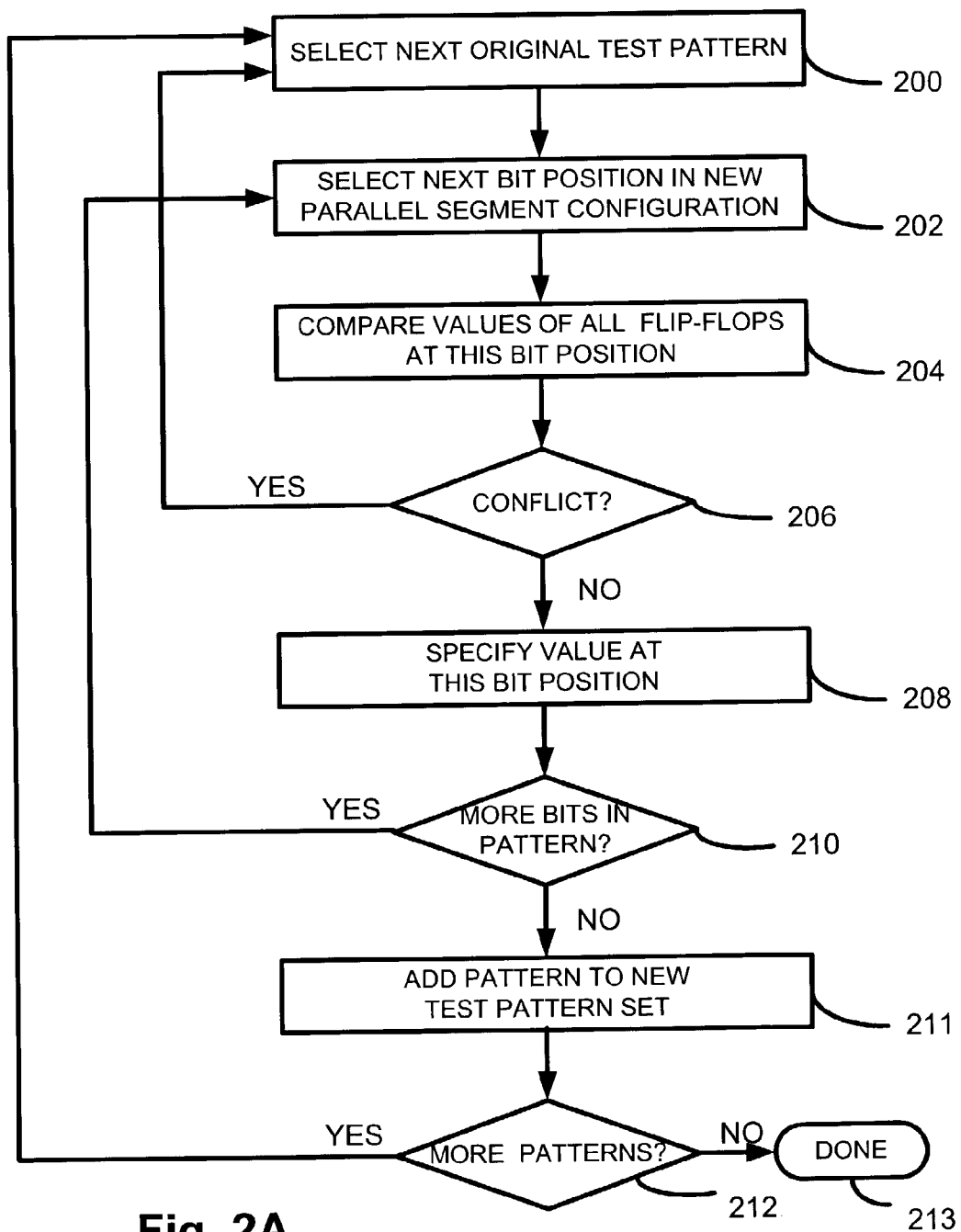
FIG. 2A displays a flowchart depicting a method implemented in accordance with the teachings of the present invention.
Figure 2B:
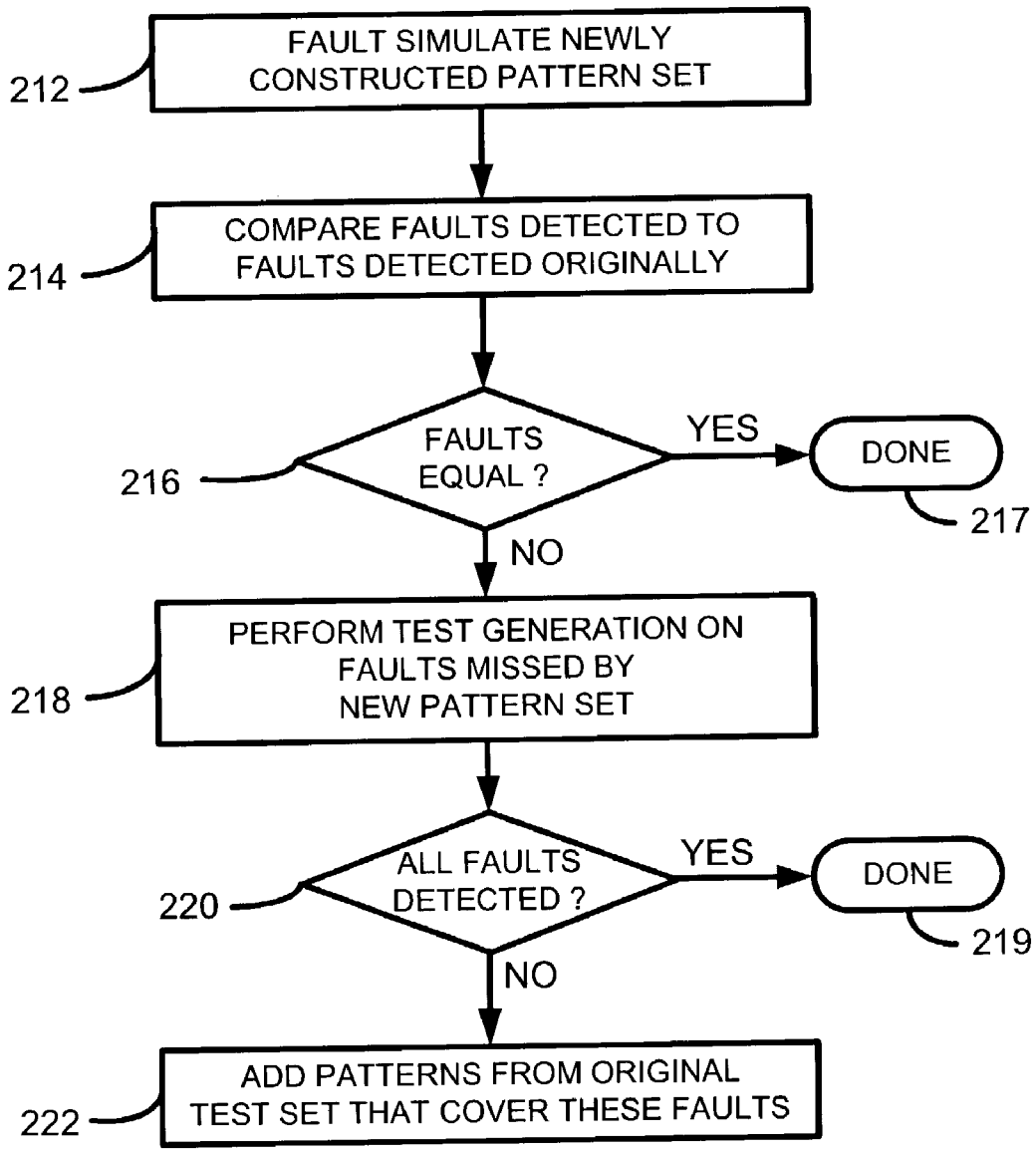
FIG. 2B displays a second flowchart depicting a second method implemented in accordance with the teachings of the present invention.

The methodology of the present invention will be presented in conjunction with the flowcharts of FIGS. 2A and 2B. There are three items that are given in the methodology: (1) an original test pattern set that was generated without constraints (meaning that a logical 0 or a logical 1 may be scanned into every flip-flop); (2) a list of faults detected by the original test pattern set (which was enumerated by ATPG); and (3) a proposed grouping of flip-flops into parallel scan segments.

With the foregoing as a given, the first part of the method of the present invention will be described with respect to FIG. 2A. In the methodology of the present invention, each original test pattern in the original test pattern set is selected and analyzed as stated at 200. A sub-process is then performed on each bit in the selected original test pattern as stated at 202.

It should be appreciated that the original test pattern set is generated to test a device, such as an integrated circuit, with a specific scan chain configuration. The configuration consists of a number of flip-flops organized as a serial scan chain and impose no constraints on the values which may be loaded into any given flip-flop. This scan configuration is then rearranged into parallel scan segments for the analysis. The organization of the flip-flops into the parallel scan segments are given as stated above, so that for each bit position in the proposed parallel scan segment configuration in which an input data pin is shared, the list of all flip-flops at that bit position across all segments is available to the analysis routine. A linear-time analysis (i.e., method) is then implemented (i.e., steps 204 and 206). Therefore, in step 204, a comparison can be performed which checks the compatibility of the values in all the flip-flops at a given bit position. Compatibility exists if all flip-flops contain either the same logical value or a "don't care" value. Stated conversely, incompatibility exists if at least one flip-flop at a given bit position is specified as a logical 0 while at least one other flip-flop at that same bit position is specified as a logical 1.

A test is performed at 206 to determine if the bit under analysis is in conflict. If a conflict is found, then the original bit pattern under analysis is rejected and the method loops back to step 200. If no conflicts are found at step 208, a value that is compatible with all the flip-flops at the bit position under analysis is specified. Specifying values at various bit positions generates a new test pattern. If the entire original test pattern under analysis is conflict free as stated at 210, the new test pattern is added to the new pattern set as stated in step 211. A test is then made to determine if more patterns are available for testing as stated at 212. If more patterns are available then the method loops back to step 200. If more test patterns are not available then the method is done as shown at 213.

After the entire original test pattern set has been analyzed to produce the new pattern set for the parallel scan chain segment configuration depicted in FIG. 2A, the second part of the method and apparatus of the present invention, described with respect to FIG. 2B, can be applied to the newly created pattern set.

As shown in FIG. 2B, fault simulation is performed to determine which faults are detected by the new test pattern set as stated at step 212. At step 214, the faults detected by the new test pattern set are compared with the faults detected by the original test pattern set. A test is performed at step 216 to determine if the faults detected by the new test pattern set are the same as the faults detected by the original test pattern set. If so, then the new pattern set is complete and the process is finished as stated at 217. However, if any faults detected by the original test pattern set remain undetected by the new test pattern set, then a test generation is performed on the circuit with the parallel scan segment configuration in which an input data pin is shared for faults missed by the new test pattern set as stated at 218. In one embodiment of the present invention, the test generation is performed by using ATPG based on a defined netlist and set of faults. Any additional test patterns that test for the missed faults are added to the new test pattern set. If any of the faults detected by the original test pattern set still remain undetected (i.e., missed faults) by the newly augmented test pattern set as stated at 220, then the test patterns from the original test pattern set that detected the faults to the new test pattern set are added as stated at 222. If all the faults are detected at 220, then the process is completed as stated at 219.

Figure 3:
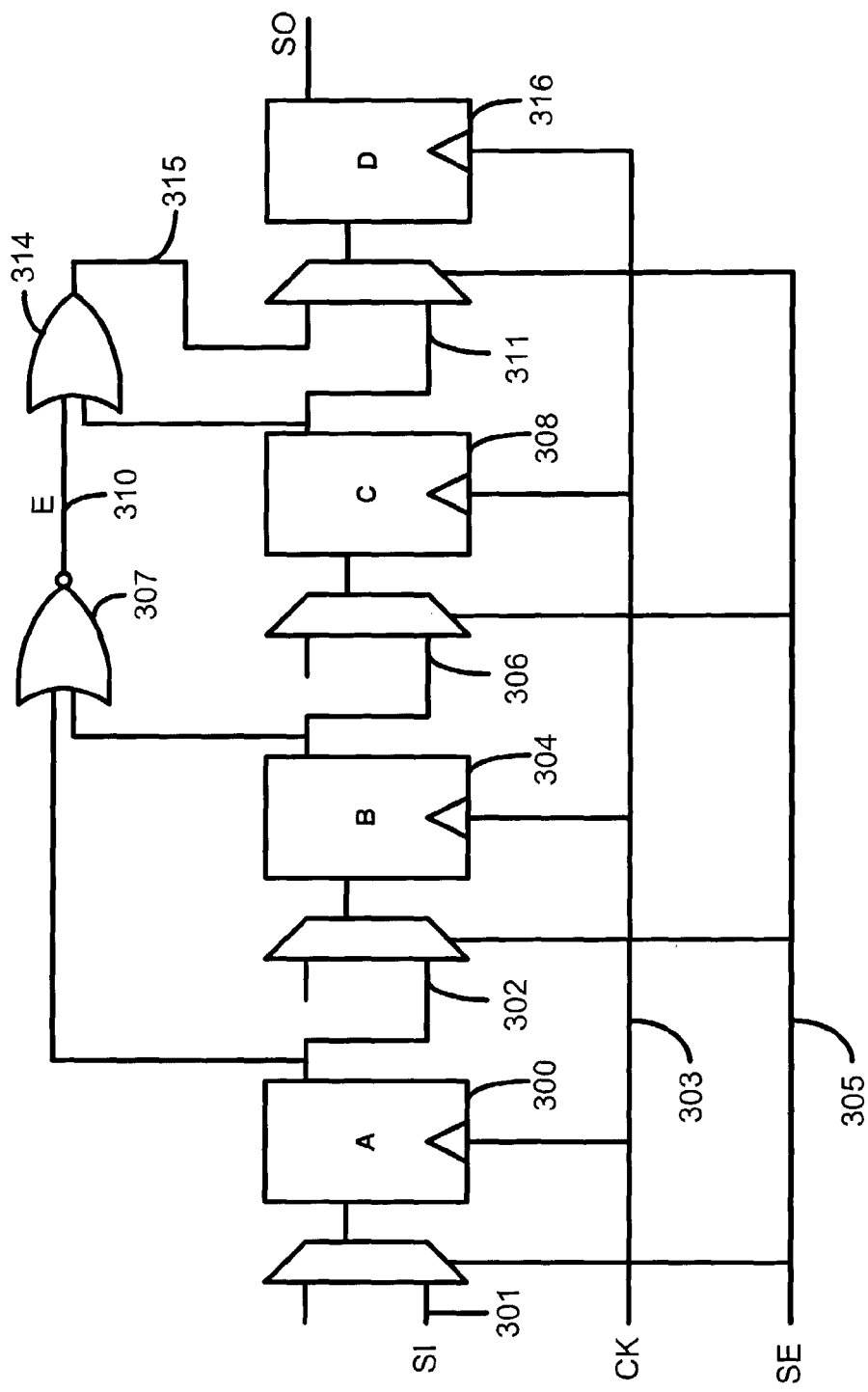
FIG. 3 displays an illustrative circuit depicting a serial scan chain configuration implemented in accordance with the teachings of the present invention.
Figure 4:
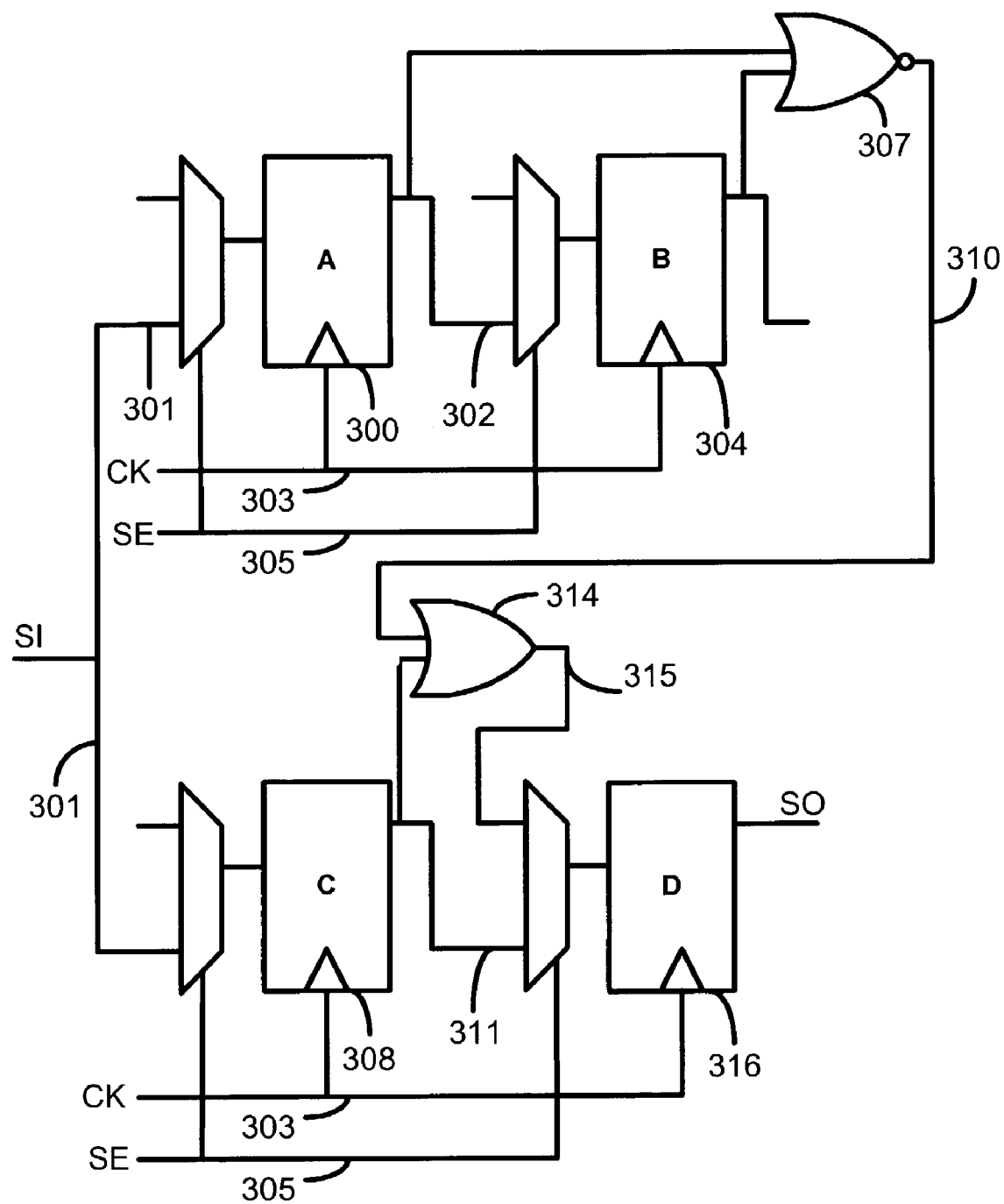
FIG. 4 displays a second illustrative circuit depicting a parallel scan chain configuration implemented in accordance with the teachings of the present invention.

The foregoing method will be demonstrated using an illustrative serial scan chain configuration depicted in FIG. 3 and an illustrative parallel scan segment configuration in which an input data pin is shared depicted in FIG. 4. In the method and apparatus of the present invention, a fault is defined as a defect that produces an incorrect logic value on a node in a circuit. For example, if a node identified as "A" has a fault that causes the node to be permanently stuck at a logical zero, the fault will be written as A@0. If a fault propagates forward in the circuit such that it produces an unexpected output on a pin of the circuit or an unexpected state in a flip-flop, the fault is considered to be detected.

In accordance with the methodology of the present invention, an original test pattern set is provided (i.e., generated), original faults detected by the original pattern set are provided, and an organization of flip-flops into parallel scan segments is provided. In FIG. 3, A flip-flop 300 B flip-flop 304, C flip-flop 308, and D flip-flop 316 are connected to form a serial scan chain of length four. A scan input data signal (SI) 301 starts the scan chain, which flows through the four flip-flops in a serial order (i.e., 300, 304, 308, 316). A clock is shown as 303. A NOR gate 307 is positioned between B flip-flop 304 and C flip-flop 308. The NOR gate 307 receives input from the output 302 of A flip-flop 300 and from the output 306 of B flip-flop 304. The NOR gate 307 produces output 310 (i.e., referred to as "E" below). The output 310 of NOR gate 307 (i.e., "E") is an input to the OR gate 314. In addition, the output 311 of C flip-flop 308 serves as an input to the OR gate 314. The OR gate 314 produces an output 315, which provides an input to the D flip-flop 316.

During operation, an original test pattern set is generated to test faults in the illustrative serial scan chain configuration shown in FIG. 3. Table 1 given below details the original test pattern set, the output of each gate, and the faults detected.

TABLE 1

| PATTERN # | A | B | C | D | DETECTED |
|---|---|---|---|---|---|
| O1 | 0 | 0 | 0 | X | A@1, B@1, E@0 |
| O2 | 0 | 1 | 0 | X | B@0, C@1, E@1 |
| O3 | 0 | 1 | 1 | X | C@0 |
| O4 | 1 | 0 | 0 | X | A@0, C@1, E@1 |

The original test patterns (i.e., original test pattern set) are shown as pattern O1, pattern O2, pattern O3, and pattern O4.

Original test pattern O1 is 000X, original test pattern O2 is 010X, original test pattern O3 is 011X, and original test pattern O4 is 100X. It should be appreciated that "X" is unspecified and may be implemented as a logical 0 or a logical 1.

Using Table 1 in conjunction with FIG. 3, if the output 302 of A flip-flop 300 is a logical 0 and the output 306 of B flip-flop 304 is a logical 0, the input to NOR gate 307 places a logical 0 on the output 302 of A flip-flop 300 and a logical 0 on the output 306 of B flip-flop 304. Therefore, the output 310 (i.e. "E") of the NOR gate 307 is a logical 1. Regardless of the output 315 of C flip-flop 308, the output 315 of OR gate 314 is a logical 1. However, in order to cause the output of OR gate 314 to change relative to the input of the NOR gate 301, the value of C flip-flop 308 is chosen by ATPG to be 0. Using the first test pattern (i.e., 000X), faults A@1, B@1, and E@0 are detected.

Fault A@1 will be discussed to illustrate fault detection. The output 302 of A flip-flop 300 is supposed to be a logical 0 based on original test pattern O1 shown in Table 1. If instead the output 302 of A flip-flop 300 is a logical 1 due to the fault A@1, then node E, the output 310 of NOR gate 307, will be a logical 0 instead of a logical 1. As a result, the output 315 of the OR gate 314 will be a logical 0 instead of a logical 1. Consequently, an incorrect state will be captured in D flip-flop 316: in a correctly manufactured circuit, the output 315 of the OR gate 314 should be a logical 1, but if this defect were present, the output 315 of the OR gate 314 would be a logical 0. This process illustrates the actions performed during fault simulation of a test pattern. Pattern 1 also detects faults B@1 and E@0.

The same methodology may be performed for the other original test patterns. As a result, the second original test pattern O2 is 010X and the second original test pattern detects B@0, C@1, and E@1. The third original test pattern (i.e., 03) is 011X and the third original test pattern detects C@0. The fourth original test pattern (i.e., 4) is 100X and the fourth original test pattern detects A@0, C@1, and E@1.

The serial scan chain configuration of FIG. 3 is then restructured into the illustrative parallel scan chain configuration in which an input data pin is shared of FIG. 4. Using FIG. 4, we identify the flip-flops that will receive the same logical state given the parallel scan chain constraint (i.e., the scan data input is shared; therefore, the flip-flops at the same bit positions in parallel segments will see the same logical bits). Reviewing FIG. 4, A flip-flop 300 and C flip-flop 308 will receive bits with the same logical state since they are both the same logical distance (0) from the shared scan input data pin 301, and B flip-flop 304 and D flip-flop 316 will receive bits with the same logical state (but possibly different than A and C) since they are both the same logical distance (1) from the shared scan input pin 301. The original test patterns are then reviewed for their conformance to the parallel scan chain constraint.

The bit patterns are reviewed to determine if the specified values for the flip-flops identified above are compatible (i.e., not in conflict). A conflict results when one flip-flop requires a logical 0 and another flip-flop receiving the same bit value requires a logical 1. If a conflict is found, the original test pattern under analysis is rejected and the next test pattern in the original test pattern set is reviewed.

Reviewing the first original test pattern (i.e., 000X), the value of the A flip-flop 300 (i.e., logical 0) and the value of the C flip-flop 308 (i.e., logical 0) are the same so there is no conflict. Therefore, the next flip-flops (i.e., 304 and 316, respectively) in the parallel segments are analyzed. The value of the B flip-flop 304 is logical 0 and the value of the D flip-flop 316 is unspecified (i.e., X), so no conflict is present. Since there is no conflict in the first original test pattern, a new pattern is specified for the parallel configuration (per FIG. 2A) as the compatible value formed by the union of all the flip-flops at this bit position. For example, using the first original test pattern, the unspecified value (i.e., X) of the D flip-flop 316 is specified to 0 to match the value in the B flip-flop 304. As a result, a new test pattern 0000 is generated. As such, both scan segments (i.e., 300, 304, and 308, 316) will receive a 00 scan pattern.

Reviewing the second original test pattern (i.e., 010X), the value of the A flip-flop 300 (i.e., logical 0) and the value of the C flip-flop 308 (i.e., logical 0) are the same so there is no conflict. Therefore, the next flip-flops (i.e., 304 and 316, respectively) in the parallel segments are analyzed. The value of the B flip-flop 304 is logical 0 and the value of the D flip-flop 316 is unspecified (i.e., X), so no conflict is present. Since there is no conflict in the second original test pattern, a new test pattern is specified for the parallel configuration (per FIG. 2A) as the compatible value formed by the union of all the flip-flops at this bit position. For example, using the second original test pattern, the unspecified value (i.e., X) of the D flip-flop 316 is specified to 1 to match the value in the B flip-flop 304. As a result, a new test pattern 0101 is generated. As such, both scan segments (i.e., 300, 304, and 308, 316) will receive a 01 scan pattern.

Reviewing the third original test pattern (i.e., 011X) shows that the value of the A flip-flop 300 is 0 and the value of the C flip-flop 308 is 1, therefore, there is a conflict so the third original pattern is rejected. Likewise, the fourth original test pattern (i.e. 100X) is reviewed. Here, the value of the A flip-flop 300 is 1 and the value of the C flip-flop 308 is 0. As such, pattern 4 has a conflict and is rejected.

In the next step of the method of the present invention, if an entire original test pattern is conflict free (i.e., the first and second original test patterns in our example) in all bit positions, the new test pattern set is fault simulated to determine faults detected by the new test pattern set. Table 3, given below, details the outcome of fault simulating the two patterns in the new test pattern set.

The faults detected by the original test pattern set (i.e., Table 2 given below, simply a restatement of Table 1) are then compared with the faults detected by the new test pattern set (i.e., Table 3 provided below) to determine any faults that were detected by the original test pattern set that were not detected by the new test pattern set.

TABLE 2

| ORIGINAL PATTERN # | A | B | C | D | DETECTED |
|---|---|---|---|---|---|
| O1 | 0 | 0 | 0 | X | A@1, B@1, E@0 |
| O2 | 0 | 1 | 0 | X | B@0, C@1, E@1 |
| O3 | 0 | 1 | 1 | X | C@0 |
| O4 | 1 | 0 | 0 | X | A@0, C@1, E@1 |

TABLE 3

| NEW PATTERN # | A | B | C | D | DETECTED |
|---|---|---|---|---|---|
| N1 | 0 | 0 | 0 | 0 | A@0, B@1, E@0 |
| N2 | 0 | 1 | 0 | 1 | B@0, C@1, E@1 |

If any faults detected by the original pattern set (i.e., Table 2) are undetected by the new pattern set (i.e., Table 3), then test generation is performed on the parallel configuration (i.e., FIG. 4) for the undetected faults. The patterns generated to detect the undetected faults are then added to the new test pattern set. Based on the comparison of Table 2 and Table 3, only two unique faults are undetected with the new test pattern set. The two faults are A@0 and C@0. As a result, test generation will be performed to try to find new test patterns that will detect these two undetected faults. If successful, these new ATPG test patterns are added to the new pattern set.

Using the illustrative parallel scan segment configuration in which a scan input data pin is shared as depicted in FIG. 4, ATPG is attempted on the two faults that are not tested by the new test patterns shown in Table 3. The results are given in Table 4 below:

TABLE 4

| FAULT | STATUS |
|---|---|
| A@0 | untestable |
| C@0 | detected by 1010 |

Table 4 given above shows that only one fault, C@0 is tested by the pattern generation step. The other fault A@0 is untestable given the parallel scan segment configuration in which a scan input data pin is shared as in FIG. 4. As a result, the new pattern (i.e., 1010) that was used to test the C@0 fault is then added to the new test pattern set. Given the foregoing, the new test pattern set is given below as Table 5:

TABLE 5

| NEW PATTERN # | A | B | C | D | DETECTED |
|---|---|---|---|---|---|
| N1 | 0 | 0 | 0 | 0 | A@0, B@1, E@0 |
| N2 | 0 | 1 | 0 | 1 | B@0, C@1, E@1 |
| N3 | 1 | 0 | 1 | 0 | C@0 |

The last step of the method of the present invention augments the new test pattern set of Table 5 with some of the original test patterns to cover any faults that are still not detected (i.e., A@0). For example, Table 6, given below, details the single original test pattern that is needed to augment the new test pattern set of Table 5. It is important to note that the three patterns described in Table 5 are two bits long, and thus can be applied at half the cost of any given original test pattern. Thus, even though the original test pattern set and the new test pattern set both have four patterns, the new test pattern set requires only 2+2+2+4=10 scan input data bits, as opposed to the 4+4+4+4=16 bits in the original pattern set.

TABLE 6

| ORIGINAL PATTERN # | A | B | C | D | DETECTED |
|---|---|---|---|---|---|
| O4 | 1 | 0 | 0 | X | A@0, C@1, E@1 |

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A method of testing comprising the steps of:
generating a test pattern set for testing a serial scan chain configuration including bit positions, the test pattern set including at least one test pattern including bits each associated with a bit position of the serial scan chain configuration;
rearranging the serial scan chain configuration into a plurality of parallel scan chains that share an input pin, including flip-flops corresponding to each of the bit positions of the first scan chain configuration;
analyzing the test pattern set for compatibility with the plurality of parallel scan chains that share an input pin, wherein compatibility exists if all flip-flops at a given bit position in each of the plurality of parallel scan chains contain an identical specified logical value and wherein an unspecified value may be specified to the identical specified logical value; and
generating a new test pattern set in response to analyzing the test pattern set for compatibility with the plurality of parallel scan chains.

2. A method of testing as set forth in claim 1, wherein the step of analyzing the test pattern set for compatibility is performed with a linear-time method.

3. A method of testing as set forth in claim 1, further comprising the steps of comparing each of the bits in the bit position to the flip-flops corresponding to the bit position and determining if there is a conflict in response to the step of comparing.

4. A method of testing as set for in claim 1, wherein the parallel scan chain configuration is an Illinois scan chain configuration.

5. A method of testing as set forth in claim 1, wherein the parallel scan chain configuration further comprises parallel scan segments that share an input pin.

6. A method of testing as set forth in claim 1, wherein the test pattern set is tested using the serial scan chain configuration to generate faults.

7. A method of testing as set forth in claim 1, wherein at least one of the bits is unspecified.

8. A method of testing as set forth in claim 1, wherein each of the bits is specified.

9. A method of testing as set forth in claim 1, wherein the majority of bits in the test pattern set are unspecified.

10. A method of testing as set forth in claim 1, wherein the majority of bits in the test pattern set are unspecified and wherein the majority of bits in the test pattern set that are unspecified may be converted to a logical state that would comply with the requirements imposed by a parallel scan segment configuration.

11. A method of testing as set forth in claim 1, wherein the test pattern set is generated without constraints.

12. A method of testing as set forth in claim 1, wherein the step of analyzing the test pattern set for compatibility further comprises the step of generating a list of faults detected by the test pattern set.

13. A method of testing as set forth in claim 1, wherein the step of generating a new test pattern set further comprises the step of generating a proposed grouping of flip-flops into parallel scan segments.

14. A testing apparatus comprising:
means for generating a test pattern set compatible with a serial scan chain configuration including bit positions, the test pattern set including at least one test pattern including bits each associated with a bit position of the serial scan chain configuration;

means for computing rearrangement of the serial scan chain configuration into a plurality of parallel scan chains that share an input pin, including flip-flops corresponding to the bit positions of the serial scan chain configuration;

means for analyzing the test pattern set for compatibility with the plurality of parallel scan chains that share an input pin, wherein compatibility exists if all flip-flops at a given bit position in each of the plurality of parallel scan chains contain an identical specified logical value and wherein an unspecified value may be specified to the identical specified logical value; and means for generating a new test pattern set in response to analyzing the test pattern set for compatibility with the plurality of parallel scan chains.

15. A memory storing computer instructions, the computer instructions causing a computer to generate test patterns, the computer instructions comprising:

instructions for generating a test pattern set compatible with a serial scan chain configuration including bit positions, the test pattern set including at least one test pattern including bits each associated with a bit position of the serial scan chain configuration;

instructions for computing rearrangement of the serial scan chain configuration into a plurality of parallel scan chains that share an input pin, including flip-flops corresponding to the bit positions of the serial scan chain configuration;

instructions for analyzing the test pattern set for compatibility with the plurality of parallel scan chains that share an input pin, wherein compatibility exists if all flip-flops at a given bit position in each of the plurality of parallel scan chains contain an identical specified logical value and wherein an unspecified value may be specified to the identical specified logical value; and instructions for generating a new test pattern set in response to analyzing the test pattern set for compatibility with the plurality of parallel scan chains.

16. A memory as set forth in claim 15, wherein the computer instructions are implemented with software.

17. A memory as set forth in claim 15, wherein the computer instructions are implemented with hardware.

18. A memory as set forth in claim 15, wherein the computer instructions are implemented as an automated test pattern generator.

* * * * *